(12) United States Patent
Hara et al.

(10) Patent No.: US 8,274,764 B2
(45) Date of Patent: *Sep. 25, 2012

(54) MAGNETO-RESISTIVE EFFECT ELEMENT PROVIDED WITH GAN SPACER LAYER

(75) Inventors: Shinji Hara, Tokyo (JP); Yoshihiro Tsuchiya, Tokyo (JP); Tsutomu Chou, Tokyo (JP); Hironobu Matsuzawa, Tokyo (JP)

(73) Assignee: TDK Corporation, Tokyo (JP)

( * ) Notice: Subject to any disclaimer, the term of this patent is extended or adjusted under 35 U.S.C. 154(b) by 739 days.

This patent is subject to a terminal disclaimer.

(21) Appl. No.: 12/382,137

(22) Filed: Mar. 10, 2009

(65) Prior Publication Data

US 2010/0232066 A1    Sep. 16, 2010

(51) Int. Cl.
    *G11B 5/39* (2006.01)
(52) U.S. Cl. ......... 360/324.1; 360/324.11; 360/324.12; 360/324.2
(58) Field of Classification Search .......... None
    See application file for complete search history.

(56) References Cited

U.S. PATENT DOCUMENTS

| | | | |
|---|---|---|---|
| 6,724,583 B2 | 4/2004 | Seigler et al. | |
| 7,035,062 B1* | 4/2006 | Mao et al. | 360/324.2 |
| 7,764,470 B2* | 7/2010 | Mizuno et al. | 360/324.1 |
| 8,000,066 B2* | 8/2011 | Mizuno et al. | 360/324.2 |
| 8,015,694 B2* | 9/2011 | Carey et al. | 29/603.16 |
| 2002/0009616 A1* | 1/2002 | Kamiguchi et al. | 428/692 |
| 2007/0081276 A1* | 4/2007 | Fukuzawa et al. | 360/313 |
| 2008/0218907 A1* | 9/2008 | Mizuno et al. | 360/313 |
| 2008/0278864 A1* | 11/2008 | Zhang et al. | 360/324.12 |
| 2010/0214701 A1* | 8/2010 | Tsuchiya et al. | 360/324.12 |

FOREIGN PATENT DOCUMENTS

| | | |
|---|---|---|
| JP | A-2002-208744 | 7/2002 |
| JP | A-2003-8102 | 1/2003 |
| JP | A-2003-204094 | 7/2003 |
| JP | A-2008-16741 | 1/2008 |
| JP | A-2008-177271 | 7/2008 |
| JP | A-2008-283173 | 11/2008 |
| JP | A-2008-283194 | 11/2008 |

* cited by examiner

*Primary Examiner* — Kevin Bernatz
(74) *Attorney, Agent, or Firm* — Posz Law Group, PLC

(57) ABSTRACT

A magneto-resistive effect (MR) element includes a first magnetic layer and a second magnetic layer in which a relative angle of magnetization directions of the first and second magnetic layers changes according to an external magnetic field; and a spacer layer that is provided between the first magnetic layer and the second magnetic layer. The spacer layer contains gallium nitride (GaN) as a main component. A thin film magnetic head according to one embodiment of the present invention is provided with the following structures: an MR element mentioned above that has a first magnetic layer and a second magnetic layer, as free layers, in which the magnetization direction in the two layers changes according to the external magnetic field; a bias magnetic field application layer that applies a bias magnetic field to the first and second magnetic layers in an orthogonal direction to an air bearing surface (ABS); the bias magnetic field application layer is formed in a rear side of the MR element seen from the ABS; and a sense current flows in an orthogonal direction to a layer surface of the MR element.

24 Claims, 11 Drawing Sheets

MAGNETO-RESISTIVE EFFECT ELEMENT PROVIDED WITH GAN SPACER LAYER

BACKGROUND OF THE INVENTION

1. Field of the Invention

The present invention relates to magneto-resistive effect elements (MR elements). Specifically, the present invention relates to the structure of a spacer layer.

2. Description of the Related Art

A thin film magnetic head that uses a giant magneto-resistive effect element (GMR element) as a reproducing head has been developed to correspond with the high recording density of a hard disk drive (HDD). Especially, a GMR element using a spin valve (SV) layer contributes to providing high sensitively thin film magnetic heads since a GMR element has a large resistance change ratio (MR ratio) to a sense current that flows in an element to read records written in a recording medium.

A current in plane (CIP)-GMR element in which a sense current flows in a parallel direction to a layer surface formed for the element was a main element among MR elements using a SV layer. However, recently a thin film magnetic head using a current perpendicular to the plane (CPP)-GMR element has been known for the further high recording density. In a CPP-GMR element, a sense current flows in a perpendicular direction to a layer surface formed for the element. The laminated structure of a typical CPP-GMR element is as follows: a lower electrode layer/a base layer/an antiferromagnetic layer/a reference layer/a spacer layer/a free layer/a cap layer/an upper electrode layer. In the specification, the marks A/B/C . . . means that the layers, A, B, C, and . . . are laminated in this order. As to the reference layer, the magnetization direction is fixed by exchange coupling with the antiferromagnetic layer, and it is also referred to as a magnetic pinned layer. As to the free layer, the magnetization direction is fixed to a direction that is roughly orthogonal in the magnetization direction of the reference layer when the external magnetic field is not applied. However, once the external magnetic field is applied, it rotates the magnetization direction according to the external magnetic field. Typically, a reference layer and a free layer are made of a magnetic layer, such as CoFe; and a spacer layer is made of Cu.

A shield layer is usually embedded in a reproducing head to restrict an area of a recording medium from which the reproducing head is affected with the external magnetic field. In a CPP-GMR element, an upper electrode layer and a lower electrode layer also work as an upper shield layer and a lower shield layer. As a result, the upper and lower shield layers are electrically connected to a SV layer in series. This structure is referred to as a CPP structure. A CPP structure has merits, such as improving heat radiation efficiency, and applying a higher operating current. In a CPP-GMR element, since a smaller sectional area has a larger resistance value and an increasing resistance change amount. In other words, a CPP-GMR element is suitable for a technology that is used for a narrower track width. A narrower track width contributes to increasing the track recording density (track per inch: TPI); and it is an essential technology for the further high recording density of a HDD.

However, a conventional CPP-GMR element with a spacer layer that is made of Cu has a limited increase of resistance change amount and output, which is obtained as a result of the increase of resistance change amount, because Cu has low resistance and a small resistance change amount in the nature of things.

Japanese laid-open patent application number 2003-204094 discloses that an insulating material is distributed along the interface in a spacer layer to obtain a CPP-GMR element with higher output. The spacer layer has a structure, for example, of Cu/NOL (nano oxide layer)/Cu.

Japanese laid-open patent application number 2002-208744 discloses that a "resistance adjustment layer" is provided anywhere inside a layer or at an interface of layers, such as a magnetic pinned layer, a free layer, and a spacer layer. The resistance adjustment layer is a layer that has a mixture layer of a conductive layer and an insulating layer; and an opening ratio of a pin hole of the resistance adjustment layer is 50% or lower. Because the conductive layer is thinner and narrower, a CPP-GMR element has a higher resistance; and the MR ratio is increased. A resistance adjustment layer can be obtained by oxidizing an alloy made of two or more metals, for example, AlCu, and by selectively forming an oxidized layer made of one of the metals.

But the technology mentioned above is not appropriate in view of reliability. Since an electric current is concentrated in the thinner and narrower conductive layer and current density is increased, local migration occurs.

SUMMARY OF THE INVENTION

The object of the present invention is to provide an MR element that has a high MR ratio by obtaining a high resistance spacer layer with a simple structure. The object of the present invention is also to provide a thin film magnetic head, a hard disk device, and so on that has such an MR element.

An MR element according to one embodiment of the present invention includes a first magnetic layer and a second magnetic layer in which the relative angle of the magnetization direction in the two layers is changed according to the external magnetic field and a spacer layer that is provided between the first magnetic layer and the second magnetic layer. The spacer layer contains gallium nitride (GaN) as a main component.

Since GaN is a semiconductor, it has a five-times or more higher MR ratio compared with Cu, which is used for a spacer layer in a conventional CPP-GMR element. This structure has also high reliability because it is a simple structure, i.e., the spacer layer includes GaN as a main component and is made to exchange a conventional Cu layer with a GaN layer. Therefore, it is possible to provide an MR element that has a high MR ratio by increasing the resistance of the spacer layer with a simple structure.

A thin film magnetic head according to another embodiment of the present invention is provided with the following structures: an MR element mentioned above that has a first magnetic layer and a second magnetic layer, as free layers, in which the magnetization direction in the two layers is changed according to the external magnetic field; a bias magnetic field application layer that applies a bias magnetic field to the first and second magnetic layers in an orthogonal direction to an opposite surface of a medium (hereinafter often referred to as an air bearing surface (ABS)); the bias magnetic field application layer is formed in a rear side of the MR element seen from an ABS; and a sense current flows in an orthogonal direction to a layer surface of the MR element.

A thin film magnetic head according to another embodiment of the present invention is provided with the following structures: an MR element mentioned above that has a first magnetic layer that is a reference layer and the magnetization direction is fixed for the external magnetic field, and a second magnetic layer that is a free layer and the magnetization direction is changed according to the external magnetic field;

and a bias magnetic field application layer that is formed in both sides of the MR element in a track width direction and applies a bias magnetic field to the second magnetic layer in a track width direction.

According to another embodiment of the present invention, a slider that has the thin film magnetic head mentioned above is provided. According to yet another embodiment of the present invention, a wafer included a laminated structure which becomes the thin film magnetic head mentioned above is provided.

According to another embodiment of the present invention, a head gimbal assembly that has the slider mentioned above and a suspension elastically supporting the slider is provided.

According to yet another embodiment of the present invention, a hard disk device that has the slider mentioned above and a positioning device supporting the slider and locating the position of the slider against a recording medium is provided.

The aforementioned objects, other objects, characteristics, and advantages of the present invention will be described below in more detail with reference to attached drawings illustrating the embodiment of the present invention.

DETAILED DESCRIPTION OF THE INVENTION

A description of the MR element and a thin film magnetic head with the MR element for a hard disk device according to one embodiment of the present invention is given below with reference to drawings.

First Embodiment

Figure 1:
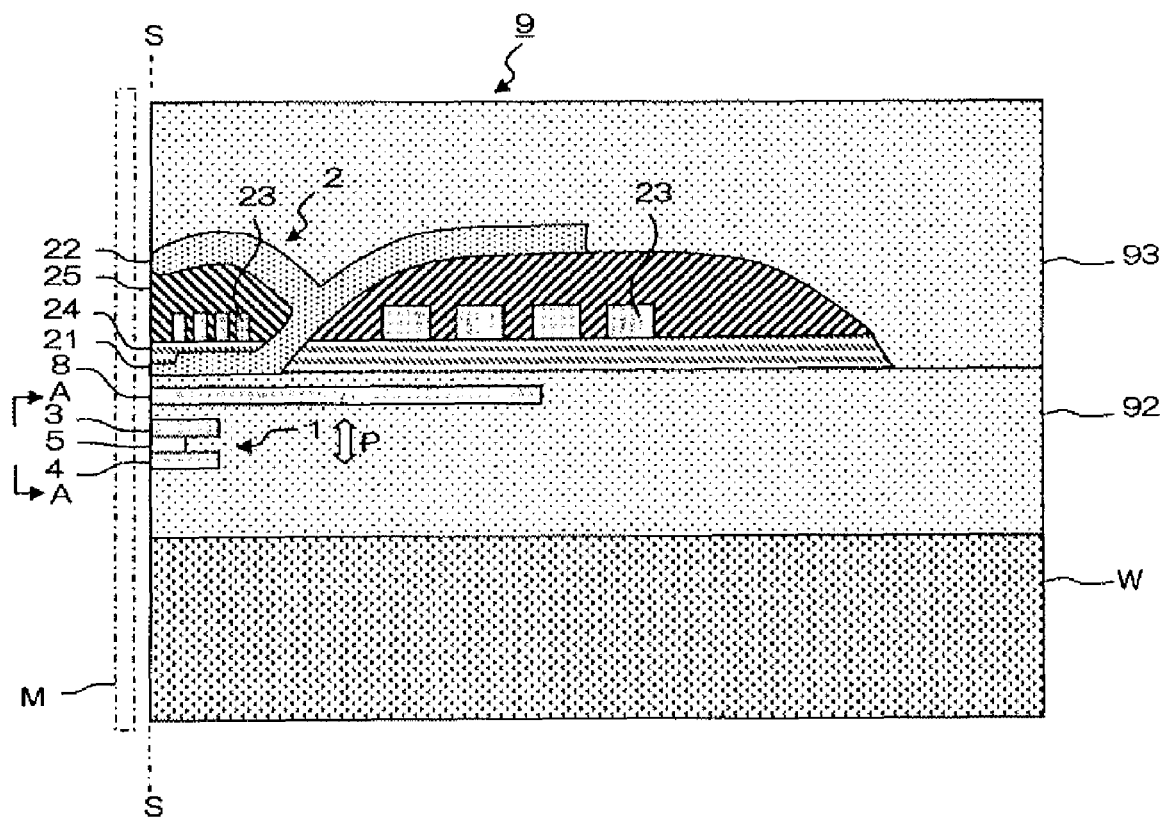
FIG. 1 is a sectional view of a main part of the thin film magnetic head according to the first embodiment of the present invention.
Figure 2:
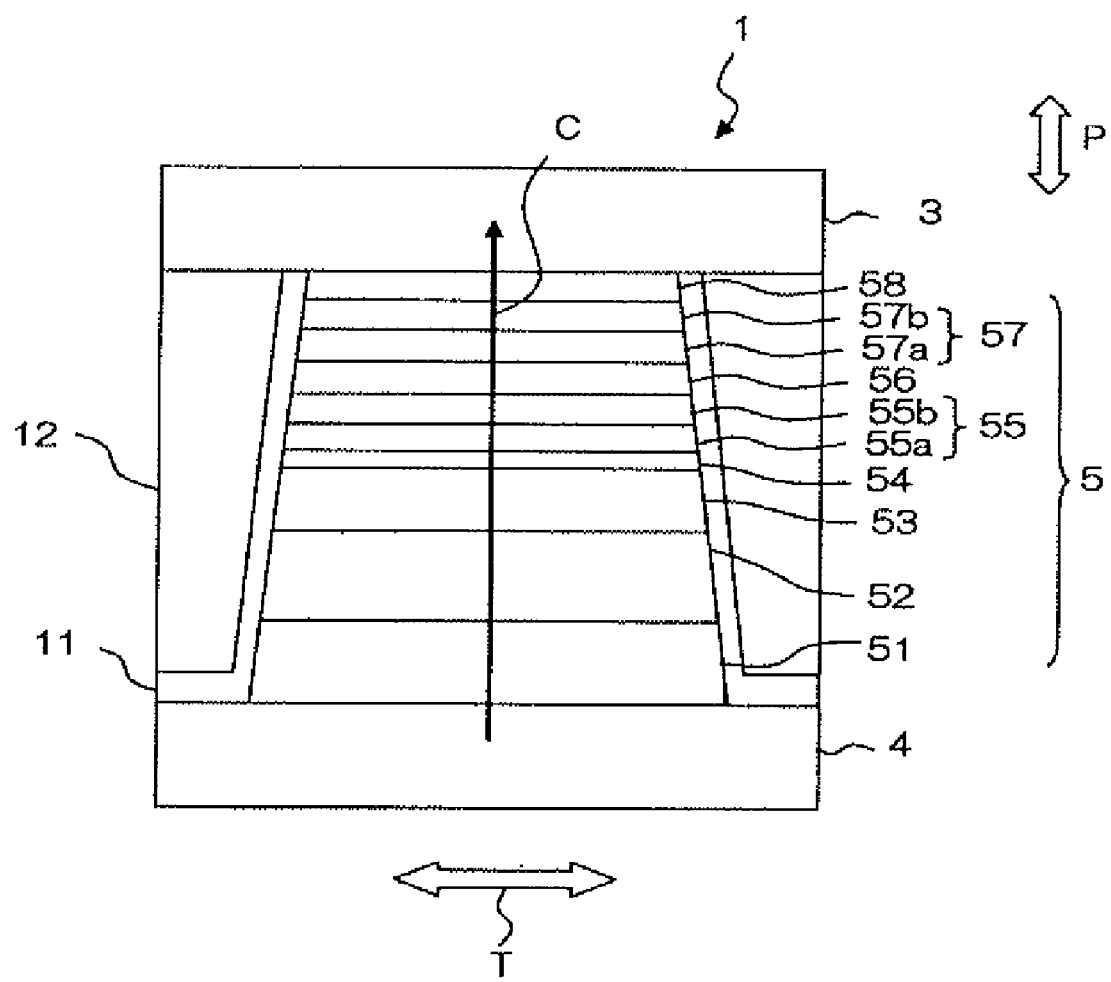
FIG. 2 is a side view of the MR element seen from the A-A direction, i.e., the ABS S, in FIG. 1.

FIG. 1 is a sectional view of a main part of such the thin film magnetic head. A thin film magnetic head 9 includes a reproducing head 1 and a recording head 2, which are formed on a substrate W. FIG. 2 is a side view of the reproducing head seen from the A-A direction in FIG. 1, namely the ABS S. The ABS S is defined as a side opposite to a recording medium M of the thin film magnetic head 9. First, as shown in FIG. 2, an explanation of the structure of the reproducing head 1 will be given.

The reproducing head 1 includes an MR element 5 made with several layers, an upper shield electrode layer 3 and a lower shield electrode layer 4 that sandwich the MR element 5 in a film surface orthogonal direction (lamination direction) P. The edge portion of the MR element 5 is, as shown in FIG. 1, exposed at the ABS S. Because of the applied voltage between the upper shield electrode layer 3 and the lower shield electrode layer 4, a sense current C flows in a film surface orthogonal direction P. A magnetic field of a recording medium M that is provided opposite to the MR element 5 varies in correspondence with the rotation of the recording medium M. The change of the magnetic field is detected as electrical resistance change based on the magneto-resistive effect. The MR element 5 reads magnetic information written in the recording medium M through this principle.

Table 1 shows an example of layer configurations of the MR element 5. Table 1 shows laminated layers from a base layer 51 that contacts the lower shield electrode layer 4 to a cap layer 58 that contacts the upper shield electrode layer 3 from the bottom up.

TABLE 1

| Layer Configuration | | Composition | Thickness (nm) |
|---|---|---|---|
| | Cap Layer 58 | Ru | 2 |
| Free Layer 57 | Upper Magnetic Layer 57b | CoFe | 2 |
| | Second Non-Metal Added Magnetic Layer 57a | $(CoFe)_{100-X}O_X$ | 2 |
| | Spacer Layer 56 | GaN | 1.6 |
| Reference Layer 55 | First Non-Metal Added Magnetic Layer 55b | $(CoFe)_{100-X}O_X$ | 2 |
| | Lower Magnetic Layer 55a | CoFe | 1 |
| | Exchange Coupling Layer 54 | Ru | 0.7 |
| | Pinned Layer 53 | CoFe | 4 |
| | Antiferromagnetic Layer 52 | IrMn | 5 |
| | Base Layer 51 | NiCr | 4 |

The MR element 5 has a laminated configuration, such as a base layer 51, an antiferromagnetic layer 52, a pinned layer 53, an exchange coupling layer 54, a reference layer (a first magnetic layer) 55, a non-magnetic spacer layer 56, a free layer (a second magnetic layer) 57, and a cap layer 58 in this order on the lower shield electrode layer 4 made of NiFe with a layer thickness of about 1-2 μm.

A reference layer 55 is a magnetic layer in which the magnetization direction is fixed for the external magnetic field. A free layer 57 is a magnetic layer in which the magnetization direction is changed according to the external magnetic field. A sense current C flows in a direction orthogonal to the reference layer 55, the spacer layer 56, and the free layer 57, i.e., layer surfaces of the MR element. The term, "orthogonal direction," refers not only to the case where the direction of the sense current C is rigidly orthogonal to the film surfaces, but also to the case where it is substantially orthogonal to the film surfaces. The magnetization direction of the free layer 57 and the magnetization direction of the reference layer 55 are in a relative angle relationship according to the external magnetic field. A spin-dependent scattering of conduction electrons is changed according to the relative angle, so that a change of magnetic resistance occurs. The MR element 5 reads magnetic information written in a recording medium M by detecting such change of magnetic resistance.

The reference layer 55 is exchange-coupled with a pinned layer 53 through an exchange coupling layer 54. The pinned layer 53 is exchange-coupled with an antiferromagnetic layer 52. As a result, the magnetization direction of the reference layer 55 is strongly fixed. Therefore, the reference layer 55 maintains a stable magnetization state, and the effective magnetization of the entire element including the reference layer 55 and the pinned layer 53 is controlled.

A spacer layer 56 contains gallium nitride (GaN) as the main component. The term, "main component," refers not only to a case where a trace of a component other than GaN is contained in the spacer layer 56, but also to a case where the spacer layer 56 contains only GaN. Since GaN is classified as a semiconductor, its resistance value is larger than Cu, which is used in a conventional spacer layer; therefore, the resistance change of GaN is also large. A large MR ratio can be obtained compared with a conventional MR element using Cu as a spacer layer. Since GaN is apt to form on a magnetic layer, with respect to a layered structure in which GaN is directly formed on a magnetic layer, a large MR ratio is obtained compared with ZnO, which is well-known as a material for a spacer layer.

A base layer 51 is formed to have a good exchange coupling between an antiferromagnetic layer 52 and a pinned layer 53. A cap layer 58 is formed to prevent each layer of laminated layers from degradation. An upper shield electrode layer 3, which is made of a NiFe layer with a layer thickness of about 1-2 μm, is formed on or above the cap layer 58.

Bias magnetic field application layers 12 are formed at both sides of the MR element 5 in a track width direction T through an insulating layer 11 and a base layer (not shown) that is made, for example, of Cr, or CrTi. The bias magnetic field application layers 12 are magnetic domain control layers in order to make a free layer 57 a single magnetic domain and to apply a bias magnetic field to the free layer 57 in a track width direction T. The insulating layer 11 is made, for example, of $Al_2O_3$. The bias magnetic field application layers 12 are made, for example, of CoPt, or CoCrPt.

A description of the structure of the reference layer 55 and the free layer 57 is given below in detail. The reference layer 55 includes a lower magnetic layer 55a that is made of CoFe and is located to face an exchange coupling layer 54, and a first non-metal added magnetic layer 55b that contains CoFe and oxygen (O) and is located to face a spacer layer 56. Similarly, the free layer 57 includes a second non-metal added magnetic layer 57a that contains CoFe and oxygen (O) and is located to face the spacer layer 56, and an upper magnetic layer 57b that is made of CoFe and is located to face a cap layer 58. A composition of the first non-metal added magnetic layer 55b and the second non-metal added magnetic layer 57a is represented by $(CoFe)_{100-x}O_x$. Here, x is an atomic fraction (unit %), and x satisfies the following relationship as explained later: $1 \leq x \leq 10$. It is preferred that an atomic fraction of the first non-metal added magnetic layer 55b is the same as that of the second non-metal magnetic layer 57a, but this is not always necessary.

As discussed above, a high MR ratio is obtained when the spacer layer 56, which contains GaN as a main component, is used. However, GaN has a characteristic of large temporal change of the MR ratio (output). It is thought by the inventors that one cause for the temporal change of the MR ratio is that nitrogen (N) in GaN is diffused into a reference layer 55 and a free layer 57. It is thought by the inventors that one cause for this diffusion phenomenon is that the reproducing head reaches a high temperature (~80° C.) by heat from electrifying while the HDD is in use.

Specifically, it is understood that the diffusion phenomenon is caused by the high standard electrode potential of gallium (Ga) in GaN. Table 2 shows a list of the standard electrode potential of several metals. $Al_2O_3$ and MgO, for example, are used for a spacer layer of a tunnel magnetoresistive (TMR) element. ZnO and so on is used for a spacer layer for a CPP-GMR element. The standard electrode potential of Ga is large (absolute value is small) compared with these metal elements (Al, Mg, and Zn) of the oxide layers. A large standard electrode potential means that it is difficult for a metal element to become a positive ion. It is understood that gallium (Ga) in GaN is in an ion (positive ion) state. The standard electrode potential of gallium (Ga) is −0.53. The standard electrode potential of representative magnetic elements, Fe, Co, and Ni are −0.44, −0.28, and −0.26, respectively, and these are close to that of gallium (Ga). Therefore, only gallium (Ga) is not apt to be ionized. In other words, a force that works to maintain a nitrogen (N) ion in a GaN layer by turning the gallium into a positive ion is weak, or a force that works to maintain a nitrogen (N) ion that is a negative ion in a GaN layer is weak. Therefore, the possibility of diffusing a nitrogen (N) ion into a reference layer 55 and a free layer 57 is overwhelmingly higher than that of MgO and ZnO and so on.

TABLE 2

| Standard Electrode Potential | |
| --- | --- |
| Element | Standard Electrode Potential (V) |
| Mg | −2.37 |
| Al | −1.66 |
| Zn | −0.76 |
| Ga | −0.53 |
| Fe | −0.44 |
| Co | −0.28 |
| Ni | −0.26 |

Because of reasons discussed above, in a system where Fe, Co, and Ni exist close to a GaN layer, diffusing nitrogen (N) into a magnetic layer by the passage of time and heat and decreasing crystallization of a GaN layer by the nitrogen (N) diffusion, it is understood that degradation of an MR ratio occurs.

In order to resolve the above mentioned problems, in the present embodiment, a non-metal element that is apt to become a positive ion is added into the reference layer 55 and the free layer 57 in advance. Specifically, the MR element includes a magnetic layer (non-metal added magnetic layer) containing oxygen (O). Therefore, the movement of nitrogen (N) from GaN to the reference layer 55 and the free layer 57 is obstructed by oxygen (O) in the non-metal added magnetic layer, and then the diffusion of nitrogen (N) from GaN can be prevented. It is preferable that non-metal added magnetic layers 55b and 57a containing oxygen (O) are provided in the areas of the reference layer 55 and the free layer 57 that face the spacer layer 56, respectively, to prevent the diffusion of nitrogen (N) from GaN.

Although, CoFe is used for the reference layer 55 and the free layer 57 in the present embodiment, when the reference layer 55 and the free layer 57 are configured with Fe, Co, and Ni as discussed above, the non-metal added magnetic layer works properly. Therefore, even though the reference layer 55 and the free layer 57 are configured with NiFe or CoNiFe, the same effect can be obtained by adding oxygen (O) in NiFe or CoNiFe.

The added non-metal is not limited to oxygen (O). Nitrogen (N), fluorine (F), or chlorine (Cl) can be added. Two or more elements from the group of oxygen (O), nitrogen (N), fluorine (F), and chlorine (Cl) can also be added.

It is also effective that a diffusion prevention layer (not shown) made of any of Cu, Au, Ag, Zn, Cr, Rh, Pt, Pd, and Ir, is inserted either between the reference layer 55 and the spacer layer 56 or between the free layer 57 and the spacer layer 56 or both between the reference layer 55 and the spacer layer 56 and between the free layer 57 and the spacer layer 56. These metals prevent the diffusion of oxygen (O). When these metals are used along with the non-metal added magnetic layers 55b and 57a, the diffusion of oxygen (O) can be further prevented.

The reference layer 55 and the free layer 57 are formed by sputtering. The following methods can be used to add nitrogen (N) and oxygen (O): a method for having these elements contained in a target material; and a method for having these elements contained in a sputtering environment.

The present embodiment discussed above is applied to a CPP structure in which a sense current flows perpendicular to a layer surface. Similarly, the present embodiment can be applied to a CIP-GMR element in which a sense current flows parallel to a layer surface formed for the element.

Referring to FIG. 1 again, the recording head 2 is formed above the reproducing head 1 through an interelement shield layer 8, which is formed by sputtering, or the like. The recording head 2 has the structure for so-called perpendicular magnetic recording. A magnetic pole layer for recording includes a main magnetic pole layer 21 and an auxiliary magnetic pole layer 22. These magnetic pole layers 21 and 22 are formed by a frame plating method and so on. The main magnetic pole layer 21 is made of FeCo, and is exposed at the ABS S in an orthogonal manner. A coil layer 23 is wound around the main magnetic pole layer 21, and extends over a gap layer 24, which is made of an insulating material, so that the magnetic flux is induced to the main magnetic pole layer 21 by the coil layer 23. The coil layer 23 is formed by a frame plating method or the like. The magnetic flux is guided through the inside of the main magnetic pole layer 21 and is emitted toward the recording medium from the ABS S. The main magnetic pole layer 21 has a narrowed size around the ABS S, not only in the film surface orthogonal direction P, but also in the track width direction T (refer to FIG. 2). Therefore, it generates a minute and strong writing magnetic field that is suitable for high recording density.

The auxiliary magnetic pole layer 22 is a magnetic layer that is magnetically connected with the main magnetic pole layer 21. The auxiliary magnetic pole layer 22 is a magnetic pole layer with a layer thickness of about 0.01-0.5 μm and is an alloy, for example, that is made of either two or three of the following materials, Ni, Fe, and Co. The auxiliary magnetic pole layer 22 is branched from the main magnetic pole layer 21 and faces the main magnetic pole layer 21 through the gap layer 24 and a coil insulating layer 25 in the ABS S. The edge portion of the auxiliary magnetic pole layer 22 in the ABS S forms a trailing shield part of which the layer cross section (area) in the edge portion is larger than other portions of the auxiliary magnetic pole layer 22. Because of providing the auxiliary magnetic pole layer 22, the magnetic field gradient between the auxiliary magnetic pole layer 22 and the main magnetic pole layer 21 is precipitous in the area near the ABS S. As a result, signal output jitter is small, and the error rate of reading (or reproducing) is small.

Insulating layers 92 and 93 are provided in the area where the reproducing head 1 and the recording head 2 that are explained above do not exist.

Second Embodiment

Figure 3:
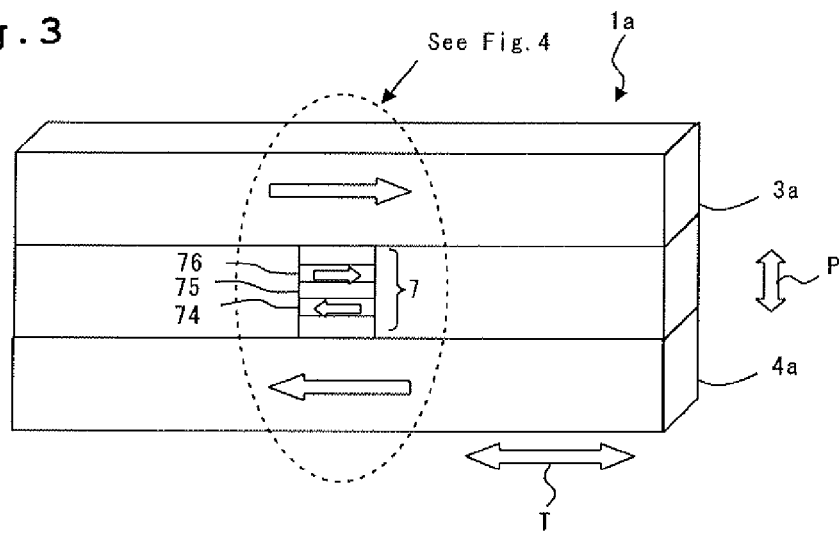
FIG. 3 is a perspective view of a main part of the MR element seen from the ABS of the thin film magnetic head according to the second embodiment of the present invention.
Figure 4:
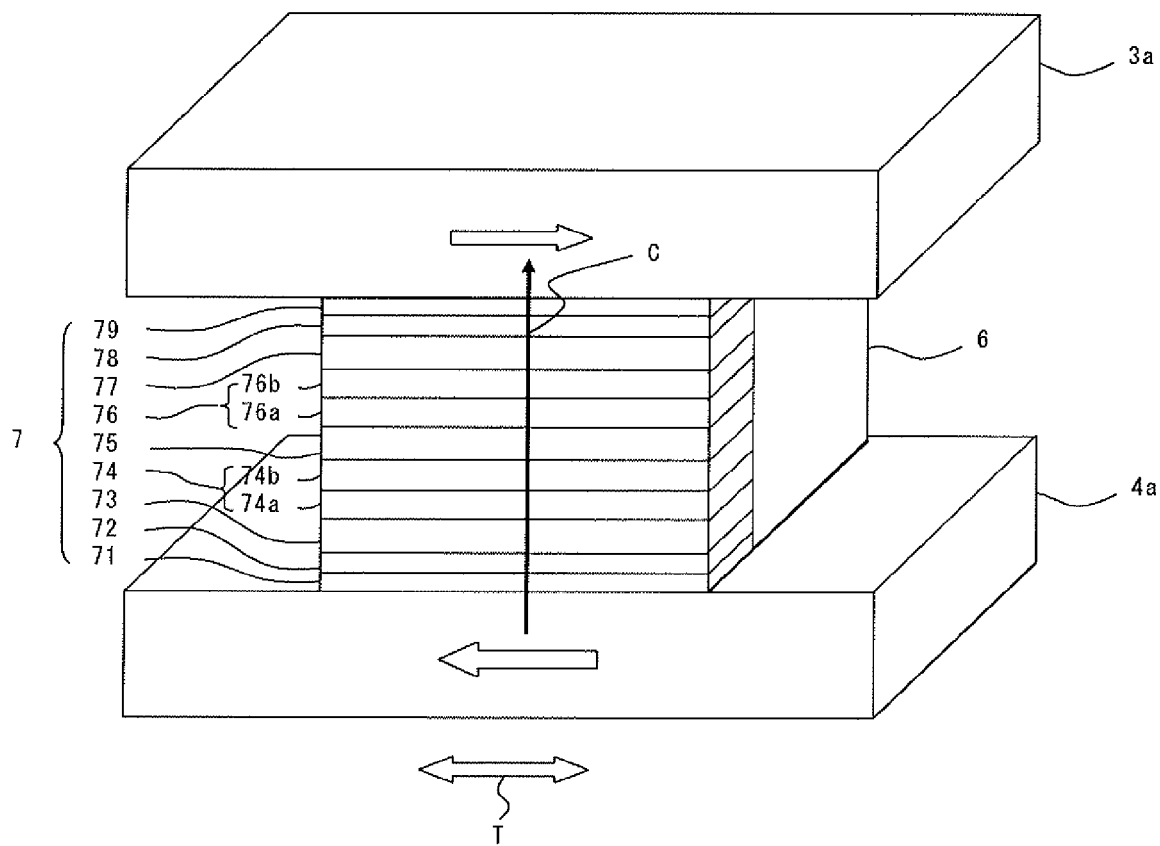
FIG. 4 is a partial enlargement perspective view of FIG. 3.

FIG. 3 is a perspective view of a main part of a reproducing head 1a seen from the ABS of the thin film magnetic head according to the present embodiment. FIG. 4 is a partial enlarged perspective view of FIG. 3. The thin film magnetic head according to the present embodiment has the same structure of the first embodiment shown in FIG. 1 except for the structure of the reproducing head 1a. The reproducing head 1 includes an MR element 7 made with several layers that are laminated, and an upper shield electrode layer 3a and a lower shield electrode layer 4a, which sandwich the MR element 7 in a film surface orthogonal direction (lamination direction) P in the manner of the first embodiment. Table 3 shows an example of layer configurations of the MR element 7. Table 3 shows laminated layers from an exchange coupling transmitting layer 71, which contacts the lower shield electrode layer 4a, to an exchange coupling transmitting layer 79, which contacts the upper shield electrode layer 3a, from the bottom up.

TABLE 3

| Layer Configuration | | Composition | Thickness (nm) |
|---|---|---|---|
| Exchange Coupling Transmitting Layer 79 | | Ru | 0.8 |
| Gap Adjustment Layer 78 | | CoFe | 1.0 |
| Exchange Coupling Transmitting Layer 77 | | Ru | 0.8 |
| Second Free Layer 76 | Upper Magnetic Layer 76b | CoFe | 2 |
| | Second Non-Metal Added Magnetic Layer 76a | $(CoFe)_{100-X}O_X$ | 2 |
| Spacer Layer 75 | | GaN | 1.6 |
| First Free Layer 74 | First Non-Metal Added Magnetic Layer 74b | $(CoFe)_{100-X}O_X$ | 2 |
| | Lower Magnetic Layer 74a | CoFe | 1 |
| Exchange Coupling Transmitting Layer 73 | | Ru | 0.8 |
| Gap Adjustment Layer 72 | | CoFe | 1.0 |
| Exchange Coupling Transmitting Layer 71 | | Ru | 0.8 |

Referring to FIGS. 3 and 4, the MR element 7 includes a pair of upper and a lower magnetic layers in which the magnetization direction is changed according to the external magnetic field (a first free layer 74 formed at the lower side of a lamination direction and a second free layer 76 formed at the upper side of a lamination direction). A spacer layer 75, which contains GaN as a main component, is provided between the first and second free layers 74 and 76. An exchange coupling transmitting layer 71, a gap adjustment layer 72, and an exchange coupling transmitting layer 73 are formed between the first free layer 74 and a lower shield electrode layer 4a. Similarly, an exchange coupling transmitting layer 77, a gap adjustment layer 78, and an exchange coupling transmitting layer 79 are formed between the second free layer 76 and an upper shield electrode layer 3a. The exchange coupling transmitting layers 71, 73, 77, and 79 are made of ruthenium (Ru). The gap adjustment layers 72 and 78 are made of CoFe. A sense current C flows in a perpendicular direction to a layer surface of the MR element 7.

The upper shield electrode layer 3a and the lower shield electrode layer 4a are magnetized in antiparallel directions to each other as shown with arrows in FIGS. 3 and 4. The term, "antiparallel," means that the magnetization directions are parallel and one magnetization direction is opposite to another magnetization direction. There are several methods to fix the magnetization directions of the upper shield electrode layer 3a and the lower shield electrode layer 4a in directions antiparallel to each other. As an example, the upper shield electrode layer 3a and the lower shield electrode layer 4a are formed in an elongate shape in a track width direction T, and then, they are formed as a single magnetic domain by the shape anisotropy effect. As a result, the magnetization directions can be antiparallel. As another example, an antiferromagnetic layer is formed adjacent to the upper shield electrode layer 3a and the lower shield electrode layer 4a, and then, the magnetization directions of the upper shield electrode layer 3a and the lower shield electrode layer 4a are fixed by the antiferromagnetic coupling.

The first free layer 74 is positive-exchange-coupled with the lower shield electrode layer 4a through a first exchange coupling transmitting layer 71, a first gap adjustment layer 72, and a first exchange coupling transmitting layer 73. As a result, the first free layer 74 receives a force to align a direction of magnetization such that it is the same as that of the lower shield electrode layer 4a as shown with arrows in FIGS. 3 and 4. Similarly, the second free layer 76 is positive-exchange-coupled with the upper shield electrode layer 3a through a second exchange coupling transmitting layer 79, a second gap adjustment layer 78, and a second exchange coupling transmitting layer 77. As a result, the second free layer 76 receives a force to align a direction of magnetization such that it is the same as that of the upper shield electrode layer 3a as shown with arrows in FIGS. 3 and 4. In the present embodiment, a pair of the upper shield electrode layer 3a and the second free layer 76, and a pair of the lower shield electrode layer 4a and the first free layer 74, are magnetized in the same directions, respectively, through the exchange coupling transmitting layers 71, 73, 77, and 79. However, it is possible for the above layers to be magnetized in opposite directions by changing a number or a layer thickness of the exchange coupling transmitting layers. When this type of technology is used, it is not necessary that the upper shield electrode layer 3a and the lower shield electrode layer 4a are magnetized in an antiparallel direction to each other. They can be magnetized in a parallel direction to each other.

Figure 5:
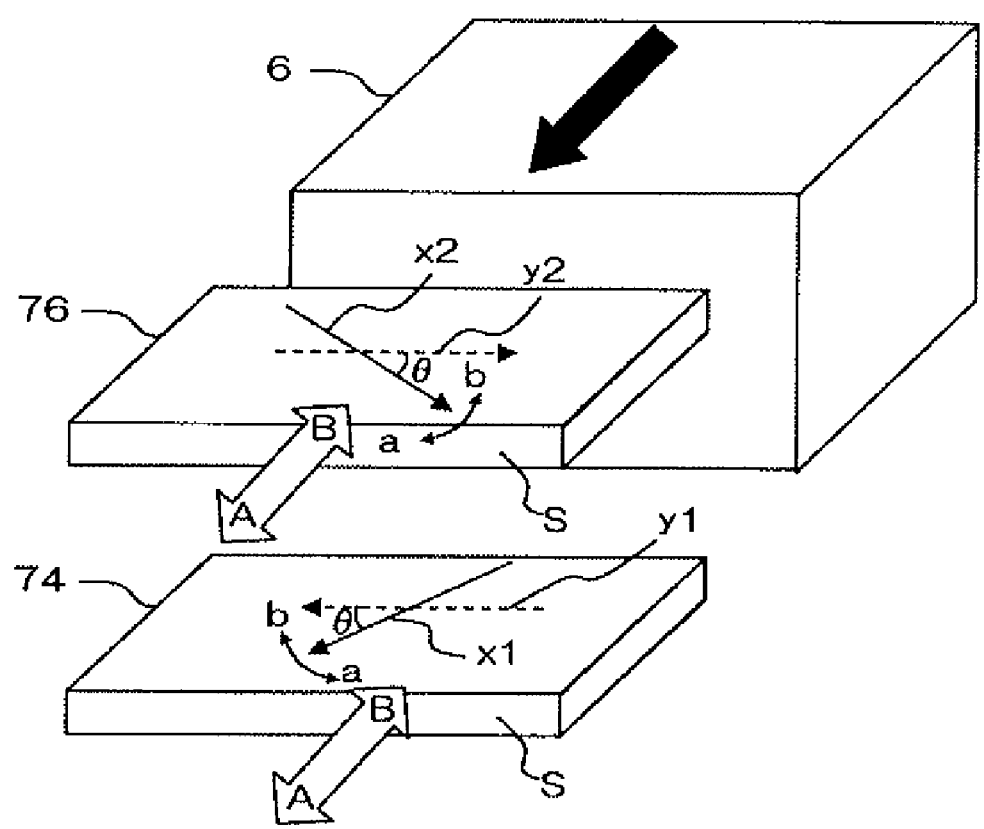
FIG. 5 is a schematic view of the magnetization state of the first and second free layers of the MR element shown in FIG. 3.
Figure 6A:
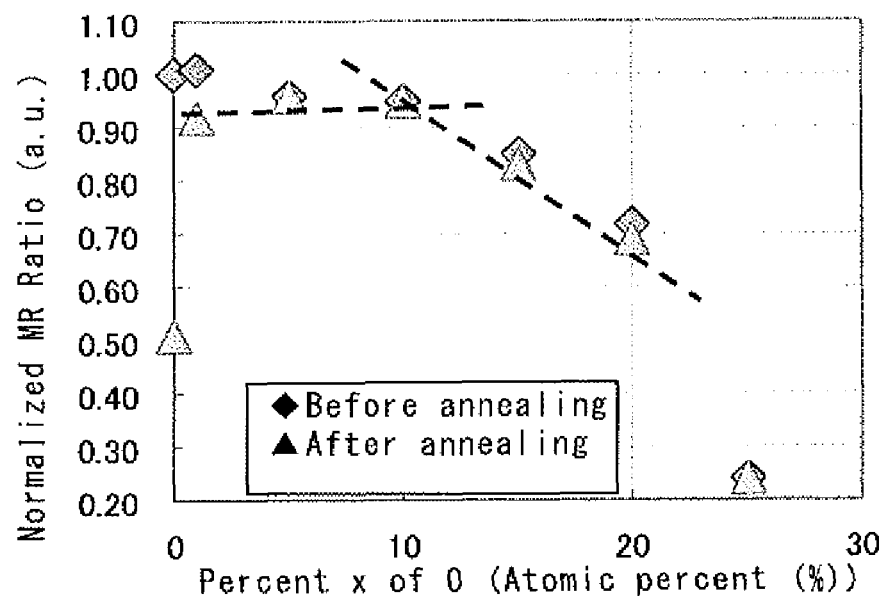
FIGS. 6A-6D are graphs showing the MR ratio and temporal change of the MR element in which both a free layer and a reference layer include a non-metal added magnetic layer.
Figure 6B:
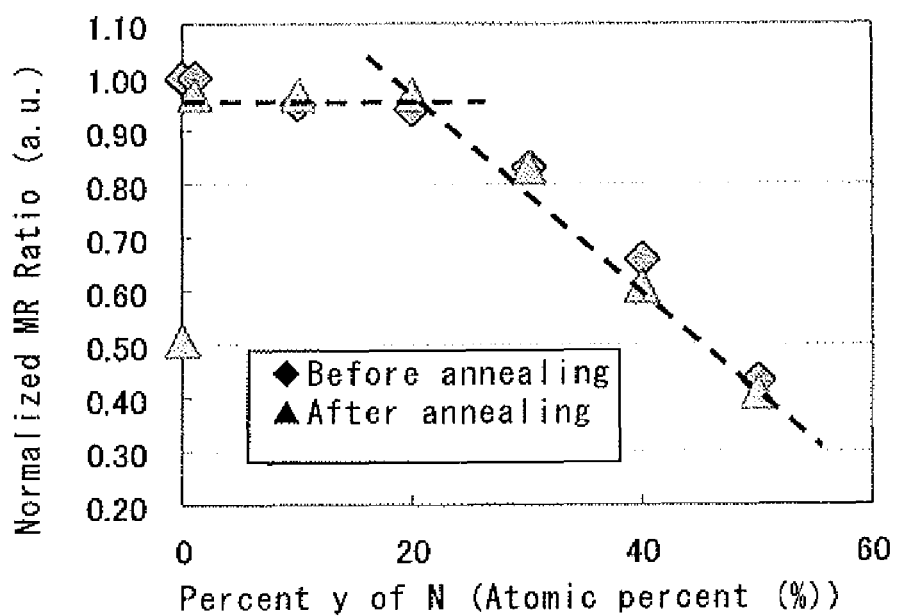
Figure 6C:
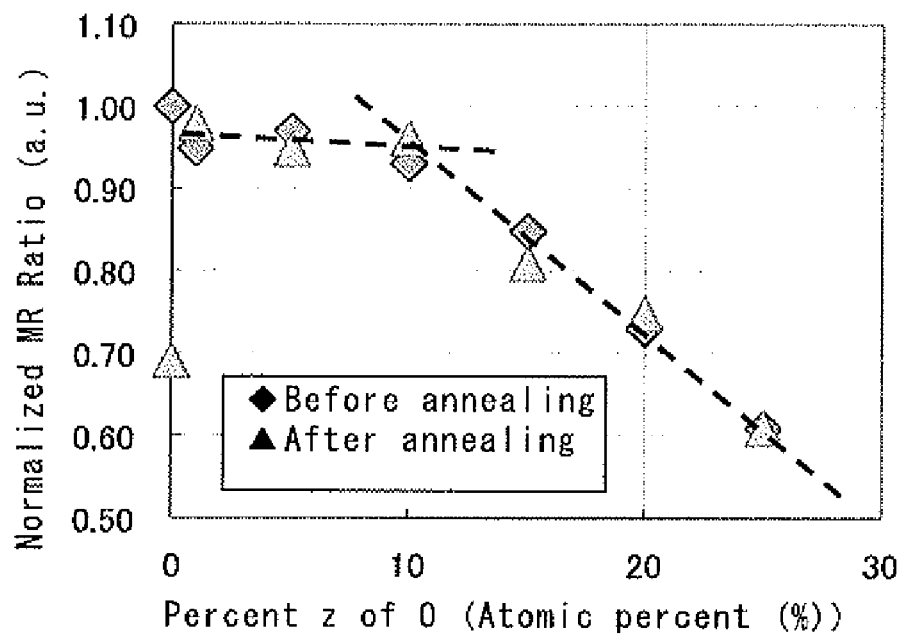
Figure 6D:
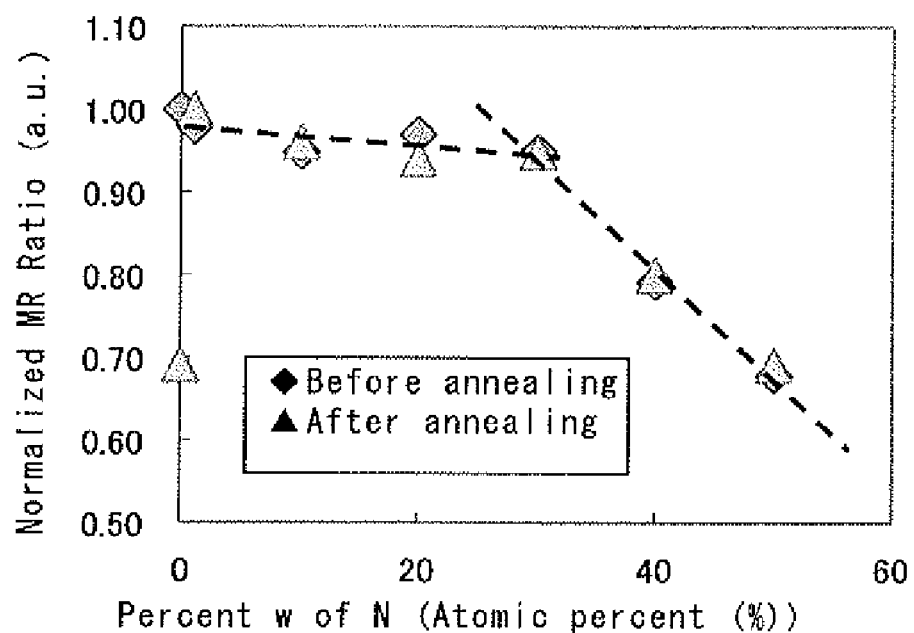
Figure 7A:
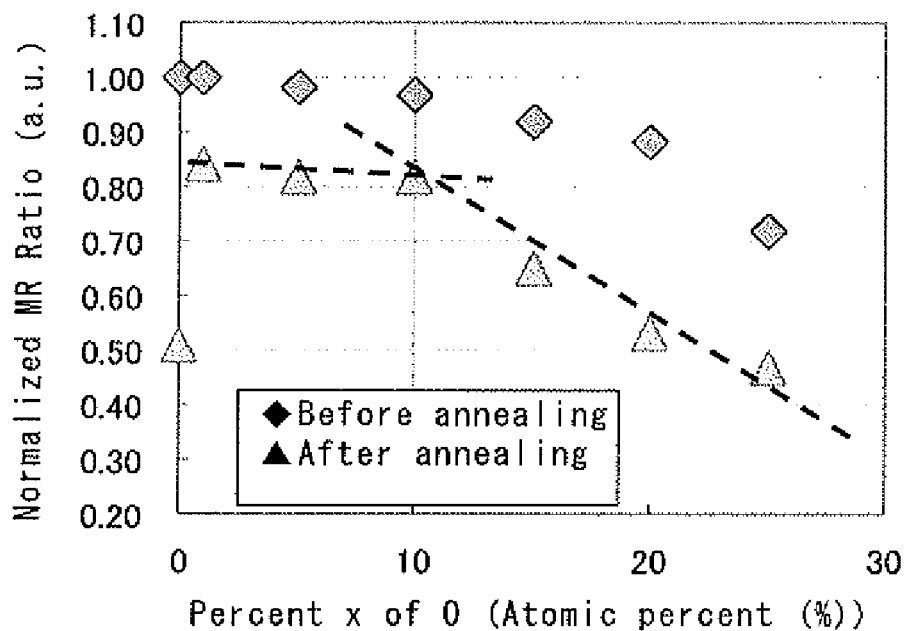
FIGS. 7A-7D are graphs showing the MR ratio and temporal change of the MR element in which only a reference layer includes a non-metal added magnetic layer.
Figure 7B:
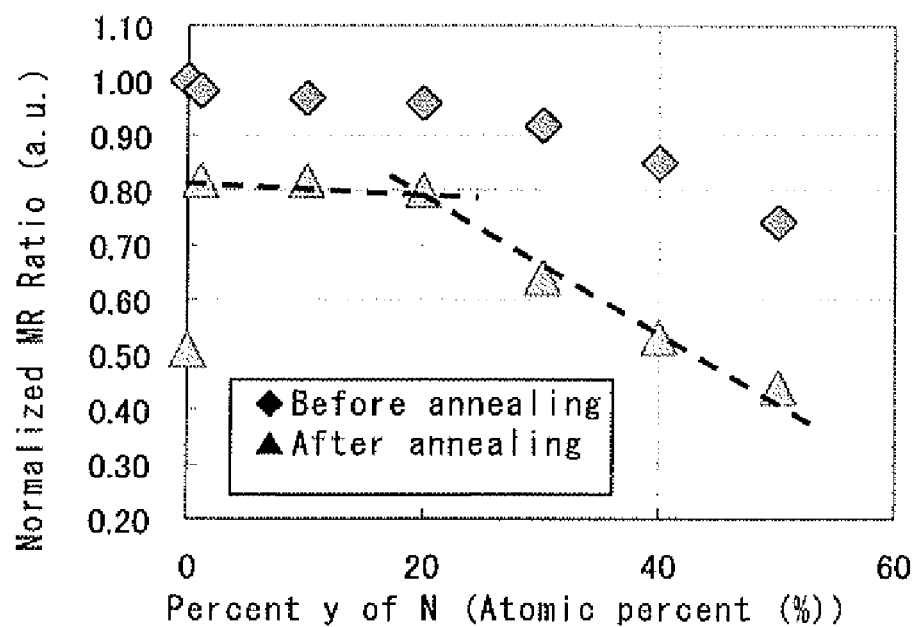
Figure 7C:
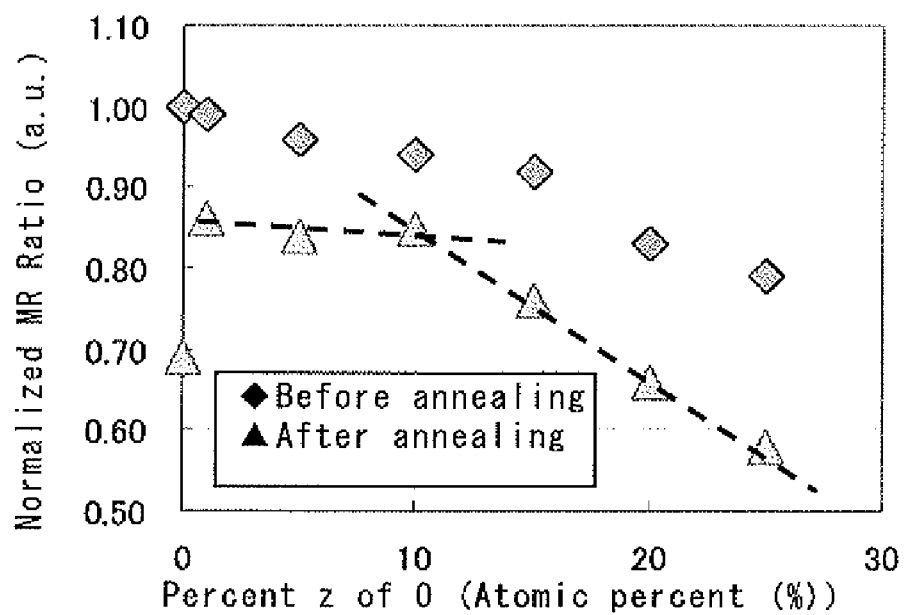
Figure 7D:
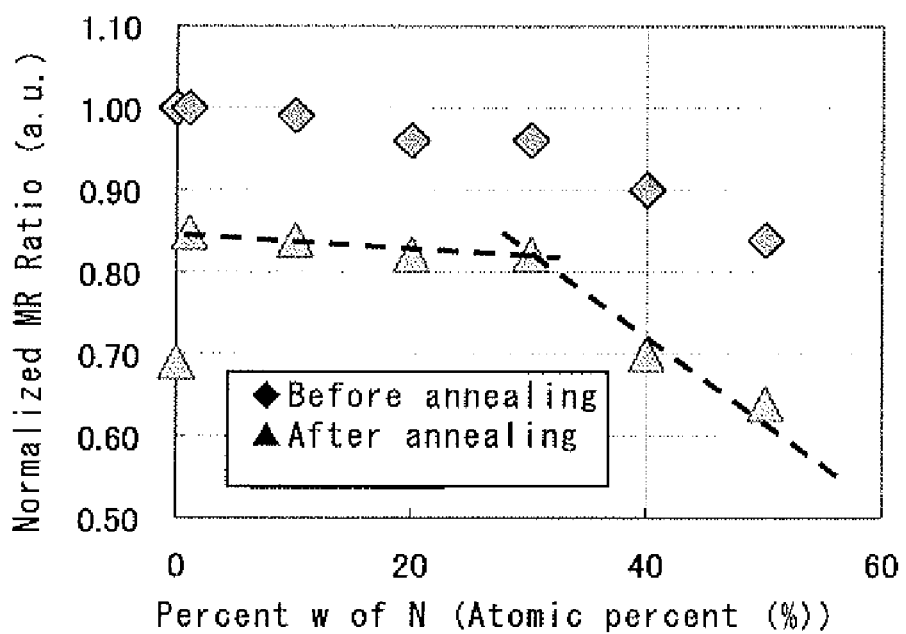

A bias magnetic field application layer 6 is provided in the rear side of the MR element 7 seen from the ABS S. FIG. 5 is a schematic view of the magnetization state of the first and second free layers. The bias magnetic field application layer 6 is magnetized in the orthogonal direction relative to the ABS S as indicated by a black bold arrow shown in the drawing. As a result, the first and second magnetic layers 74 and 76 receive a magnetic field that is in the orthogonal direction relative to the ABS S. As described above, the first and second free layers 74 and 76 are exchange-coupled with the upper shield electrode layer 3a and the lower shield electrode layer 4a, and receive a bias magnetic field from the bias magnetic field application layer 6. The magnetization directions of the first and second free layers 74 and 76 rotate in directions opposite each other for a certain angle θ from the position shown as dashed arrows y1 and y2 to the position shown as solid arrows x1 and x2 in FIG. 5. Ideally, they are orthogonal to each other.

Under these conditions, when the external magnetic field is applied in the manner of the large white arrows shown in the drawing, the magnetization directions of the first and second free layers 74 and 76 rotate in directions opposite each other based on the direction of the external magnetic field. Specifically, when the external magnetic field is applied in the direction A in the drawing, the magnetization directions (solid arrows x1 and x2) of the first and second free layers 74 and 76 rotate to the "a" direction in the drawing; and when the external magnetic field is applied in the direction B in the drawing, the magnetization directions of the first and second free layers 74 and 76 rotate to the "b" direction in the drawing. As discussed above, since the relative angle of the magnetization directions of the first and second free layers 74 and 76 is changed according to the external magnetic field, the resistance value of a sense current C is varied based on the magneto-resistive effect. An MR element 7 can detect a direction and strength of the external magnetic field through this principle.

The MR element 7 according to the present embodiment includes a pair of the free layers 74 and 76 in which the magnetization directions are changed according to the external magnetic field, and the spacer layer 75 formed therebetween. The magnetization directions of a pair of the free layer 74 and 76 rotate according to the external magnetic field. In view of this, the MR element 7 is different from the first embodiment. But there is a similarity between them because the spacer layer is made of GaN, and they function as an MR element with a CPP structure.

In the present embodiment, the first free layer 74 also includes the lower magnetic layer 74a made of CoFe and facing the exchange coupling transmitting layer 73, and the first non-metal added magnetic layer 74b contained containing CoFe and oxygen (O) and facing the spacer layer 75. Similarly, the second free layer 76 includes the second non-metal added magnetic layer 76a, which contains CoFe and oxygen (O) and faces the spacer layer 75, and the upper magnetic layer 76b made of CoFe and facing the exchange coupling transmitting layer 77. A composition of the first non-metal added magnetic layer 74b and the second non-metal added magnetic layer 76a is represented by $(CoFe)_{100-X}O_X$. Here, x is an atomic fraction (unit %), and x satisfies the following relationship as explained later: $1 \leq x \leq 10$.

The present embodiment has the same characteristics of a GaN layer as follows: in a system where Fe, Co, and Ni exist close to a GaN layer, nitrogen (N) tends to diffuse into a magnetic layer by the passage of time and heat, and crystallization of a GaN layer by the nitrogen (N) diffusion tends to be degraded. Therefore, as mentioned above, non-metal added magnetic layers 74b and 76a are provided in the areas of the first and second free layers 74 and 76 that face the spacer layer 75, respectively, to prevent nitrogen (N) from diffusing into the first and second free layers 74 and 76.

In the present embodiment, the first and second free layers 74 and 76 can be made of NiFe or CoNiFe including non-metal additions. Nitrogen (N), fluorine (F), or chlorine (Cl) can be used as the non-metal additions. Further, two or more elements from the group of oxygen (O), nitrogen (N), fluorine (F), and chlorine (Cl) can also be added.

Exemplary Embodiment

An Exemplary Embodiment is Described Below
(Manufacturing Samples 01-26)
Magneto-resistive effect layers (MR layer) are formed, in which either an oxygen (O) added magnetic layer or a nitrogen (N) added magnetic layer are formed in the both sides of a GaN spacer layer. The manufacturing processes are as follows:

(1) a base layer (NiCr 4.0 nm), an antiferromagnetic layer (IrMn 5.0 nm), a pinned layer (CoFe 4.0 nm), an exchange coupling layer (Ru 0.7 nm), a reference layer (CoFe 1.0 nm/X 2.0 nm), a spacer layer (GaN 1.6 nm), a free layer (X 2.0 nm/NiFe 2.0 nm), and a cap layer (Ru 2.0 nm) were formed in this order. Here, X represents the first non-metal added magnetic layer 55b and the second non-metal added magnetic layer 57a as discussed above. Materials used for X are shown in Table 4. Specifically, as a layer X that is a part of a reference layer and a free layer and faces a spacer layer, a $(CoFe)_{100-x}O_X$ layer (samples 01-07) is formed shown in Table 4. This $(CoFe)_{100-x}O_x$ layer was made by the following method: Oxygen (O) was added into CoFe so that an atomic fraction of oxygen (O) is x (%). Similarly, as a layer X that abuts a spacer layer, a $(CoFe)_{100-y}N_y$ layer (samples 08-13) was formed by adding nitrogen (N) to CoFe as an atomic fraction of nitrogen (N) was y (%). Similarly, a $(NiFe)_{100-z}O_Z$ layer (samples 14-20) was formed by adding oxygen (O) into NiFe as an atomic fraction of oxygen (O) was z (%). Similarly, as a layer X that abuts a spacer layer, a $(NiFe)_{100-w}N_W$ layer (samples 21-26) was formed by adding nitrogen (N) into NiFe as an atomic fraction of nitrogen (N) was w (%). A range of oxygen (O) addition was 0-25 at %. A range of nitrogen (N) addition was 0-50 at %. Oxygen (O) and nitrogen (N) were added by containing $O_2$ and $N_2$ in an environmental gas (Ar) while forming a layer.

(2) After the layers were formed, an annealing process was conducted for three hours at a temperature of 250° C.

(3) The layers mentioned above were processed into a column like structure with the size of 100 nm×100 nm; the sides of the layers were covered by an insulating layer $(Al_2O_3)$ with a layer thickness of 20.0 nm; and after an electrode was formed above, samples 01-26 were manufactured. The manufactured number of each sample was 216 elements.

TABLE 4

| Material for X | | Atomic Fraction (%) | Standardized MR Ratio | |
|---|---|---|---|---|
| | | | Before Annealing | After Annealing |
| | | x | | |
| $(CoFe)_{100-x}O_X$ | Sample 01 | 0 | 1.00 | 0.51 |
| | Sample 02 | 1 | 1.01 | 0.92 |
| | Sample 03 | 5 | 0.96 | 0.96 |
| | Sample 04 | 10 | 0.95 | 0.95 |
| | Sample 05 | 15 | 0.85 | 0.83 |
| | Sample 06 | 20 | 0.72 | 0.69 |
| | Sample 07 | 25 | 0.24 | 0.24 |
| | | y | | |
| $(CoFe)_{100-y}N_y$ | Sample 01 | 0 | 1.00 | 0.51 |
| | Sample 08 | 1 | 1.00 | 0.97 |
| | Sample 09 | 10 | 0.95 | 0.97 |
| | Sample 10 | 20 | 0.94 | 0.97 |
| | Sample 11 | 30 | 0.83 | 0.83 |
| | Sample 12 | 40 | 0.66 | 0.61 |
| | Sample 13 | 50 | 0.43 | 0.41 |
| | | z | | |
| $(NiFe)_{100-z}O_Z$ | Sample 14 | 0 | 1.00 | 0.69 |
| | Sample 15 | 1 | 0.95 | 0.98 |
| | Sample 16 | 5 | 0.97 | 0.95 |
| | Sample 17 | 10 | 0.93 | 0.96 |
| | Sample 18 | 15 | 0.85 | 0.81 |
| | Sample 19 | 20 | 0.73 | 0.75 |
| | Sample 20 | 25 | 0.61 | 0.61 |
| | | w | | |
| $(NiFe)_{100-w}N_W$ | Sample 14 | 0 | 1.00 | 0.69 |
| | Sample 21 | 1 | 0.98 | 1.00 |
| | Sample 22 | 10 | 0.95 | 0.96 |
| | Sample 23 | 20 | 0.97 | 0.94 |
| | Sample 24 | 30 | 0.95 | 0.95 |
| | Sample 25 | 40 | 0.79 | 0.80 |
| | Sample 26 | 50 | 0.68 | 0.69 |

(Manufacturing Samples 27-50)

An MR layer made of either an oxygen (O) added magnetic layer or a nitrogen (N) added magnetic layer was formed in one side of a GaN spacer layer. The manufacturing processes were as follows:

(1) a base layer (NiCr 4.0 nm), an antiferromagnetic layer (IrMn 5.0 nm), a pinned layer (CoFe 4.0 nm), an exchange coupling layer (Ru 0.7 nm), a reference layer (CoFe 1.0 nm/X 2.0 nm), a spacer layer (GaN 1.6 nm), a free layer (CoFe 2.0 nm/NiFe 2.0 nm), and a cap layer (Ru 2.0 nm) were formed in this order. Here, X represents the first non-metal added magnetic layer 55b as discussed above. Materials used for X are shown in Table 5. Samples 27-38 correspond to samples 02-14. Samples 39-50 correspond samples 15-26.

(2) After the layers were formed, an annealing process was conducted for three hours at a temperature of 250° C.

(3) The layers mentioned above were processed into a column like structure with the size of 100 nm×100 nm; the sides of the layers were covered by an insulating layer $(Al_2O_3)$ with a layer thickness of 20.0 nm; and after an electrode was formed above, samples 27-50 were manufactured. The manufactured number of each sample was 216 elements.

TABLE 5

| Material for X | | Atomic Fraction (%) | Standardized MR Ratio | |
|---|---|---|---|---|
| | | | Before Annealing | After Annealing |
| | | x | | |
| $(CoFe)_{100-x}O_X$ | Sample 01 | 0 | 1.00 | 0.51 |
| | Sample 27 | 1 | 1.00 | 0.84 |
| | Sample 28 | 5 | 0.98 | 0.82 |
| | Sample 29 | 10 | 0.97 | 0.82 |
| | Sample 30 | 15 | 0.92 | 0.65 |
| | Sample 31 | 20 | 0.88 | 0.53 |
| | Sample 32 | 25 | 0.72 | 0.47 |
| | | y | | |
| $(CoFe)_{100-y}N_y$ | Sample 01 | 0 | 1.00 | 0.51 |
| | Sample 33 | 1 | 0.98 | 0.82 |
| | Sample 34 | 10 | 0.97 | 0.82 |
| | Sample 35 | 20 | 0.96 | 0.80 |
| | Sample 36 | 30 | 0.92 | 0.64 |
| | Sample 37 | 40 | 0.85 | 0.53 |
| | Sample 38 | 50 | 0.74 | 0.44 |
| | | z | | |
| $(NiFe)_{100-z}O_Z$ | Sample 14 | 0 | 1.00 | 0.69 |
| | Sample 39 | 1 | 0.99 | 0.86 |
| | Sample 40 | 5 | 0.96 | 0.84 |
| | Sample 41 | 10 | 0.94 | 0.85 |
| | Sample 42 | 15 | 0.92 | 0.76 |
| | Sample 43 | 20 | 0.83 | 0.66 |
| | Sample 44 | 25 | 0.79 | 0.58 |
| | | w | | |
| $(NiFe)_{100-w}N_W$ | Sample 14 | 0 | 1.00 | 0.69 |
| | Sample 45 | 1 | 1.00 | 0.85 |
| | Sample 46 | 10 | 0.99 | 0.84 |
| | Sample 47 | 20 | 0.96 | 0.82 |
| | Sample 48 | 30 | 0.96 | 0.82 |
| | Sample 49 | 40 | 0.90 | 0.70 |
| | Sample 50 | 50 | 0.84 | 0.64 |

(Manufacturing Comparison Sample)

A comparison sample was manufactured by the following manner: it had a structure that exchanged a material of the spacer layer in the sample 01 with Cu as shown in Table 6. The manufacturing processes were as follows:

(1) a base layer (NiCr 4.0 nm), an antiferromagnetic layer (IrMn 5.0 nm), a pinned layer (CoFe 4.0 nm), an exchange coupling layer (Ru 0.7 nm), a reference layer (CoFe 3.0 nm), a spacer layer (Cu 2.5 nm), a free layer (CoFe 2.0 nm/NiFe 2.0 nm), and a cap layer (Ru 2.0 nm) were formed in this order.

(2) After the layers were formed, an annealing process was conducted for three hours at a temperature of 250° C.

(3) The layers mentioned above were processed into a column like structure with the size of 100 nm×100 nm; the sides of the layers were covered by an insulating layer ($Al_2O_3$) with a layer thickness of 20.0 nm; and after an electrode was formed above, sample 51 was manufactured. The manufactured number of this sample was 216 elements.

The method of measurement for the manufactured samples was as follows: It is noted that an accelerated test was conducted under an annealing environment to accelerate degradation.

(4) An MR ratio was measured while the external magnetic field, about 159 KA/m (2 kOe), was applied to the manufactured samples.

(5) After samples were annealed for 24 hours at a temperature of 120° C. as an accelerated test, an MR ratio was measured by the same method of the step (4) above.

(Comparison Between Sample 01 and Sample 51)

As a comparison result between the sample 01 and the sample 51, Table 6 shows that differences of an MR ratio depending on materials for a spacer layer, and changes by an acceleration test for them. A spacer layer of the sample 01 was made of GaN, and a spacer layer of the sample 51 was made of Cu. In both of samples, a non-metal added magnetic layer was not used for a reference layer and a free layer. An MR ratio before an annealing process (before an acceleration test) of the sample 01 was five times or more than the sample 51. Even an MR ratio after an annealing process (after an acceleration test) of the sample 01 is about three times compared with the sample 51. Therefore, it is effective that GaN is used for a spacer layer. However, even though a CPP-GMR element with a spacer layer made of GaN had a high MR ratio, the amount of decrease of the MR ratio after an annealing process (after an acceleration test) was large; and there is room to improve in view of degradation.

TABLE 6

| Material for Spacer Layer | Sample | Standardized MR Ratio | |
|---|---|---|---|
| | | Before Annealing | After Annealing |
| GaN | 01 | 1.00 | 0.51 |
| Cu | 51 | 0.19 | 0.18 |

(Comparison Among Sample 01 Through 26)

An initial MR ratio and an MR ratio after an acceleration test for each of samples are shown in Table 4. Each value of MR ratios was normalized. For example, when an MR ratio of the sample 01 (CoFe without addition of oxygen (O) and nitrogen (N)) was normalized as "1," a normalized number of an MR ratio for samples 01-13 is shown; and when an MR ratio of the sample 14 (NiFe without addition of oxygen (O) and nitrogen (N)) was normalized as "1," a normalized number of an MR ratio for samples 14-26 is shown. Changes of an MR ratio of samples that use $(CoFe)_{100-x}O_x$, $(CoFe)_{100-y}N_y$, $(NiFe)_{100-z}O_z$, and $(NiFe)_{100-w}N_w$ as a X layer for a reference layer and a free layer are shown in FIGS. 6A-6D. In each of FIGS. 6A-6D, X axis represents a atomic fraction x, y, z, and w (at %) for oxygen (O) or nitrogen (N), and Y axis represents a normalized MR ratio.

Overall, an MR ratio was decreased when the added amount of oxygen (O) and nitrogen (N) was increased, but the gradient of the decreased amount was small. The degradation of the acceleration test tends to be decreased by increasing the added amount. Critical values for an atomic fraction of oxygen (O) and nitrogen (N) in relation to an MR ratio exist because the MR ratios are suddenly decreased at a certain level or higher of an oxygen (O) atomic fraction and a nitrogen (N) atomic fraction in every case. In view of controlling the degradation, it is enough if an atomic fraction of oxygen (O) or nitrogen (N) is 1% in every case. When the above discussion is used for criterion, the effect for adding oxygen (O) or nitrogen (N) was obtained under the following situations: x=1-10 at % for $(CoFe)_{100-x}O_x$; y=1-20 at % for $(CoFe)_{100-y}N_y$; z=1-10 at % for $(NiFe)_{100-z}O_z$; and w=1-30 at % for $(NiFe)_{100-w}N_w$.

(Comparison Among Samples 01, 14, 27 Through 50)

An initial MR ratio and the MR ratio after an acceleration test for each of samples, which use an oxygen (O) or nitrogen (N) added magnetic material only for a reference layer, are shown in Table 5. Each value of the MR ratio is normalized. For example, when the MR ratio of the sample 01 (CoFe without addition of oxygen (O) and nitrogen (N)) is normalized as "1," a normalized number of the MR ratio for samples 27-38 is shown; and when the MR ratio of the sample 14 (NiFe without addition of oxygen (O) and nitrogen (N)) is normalized as "1," a normalized number of the MR ratio for samples 39-50 is shown. Changes of the MR ratio of samples that use $(CoFe)_{100-x}O_x$, $(CoFe)_{100-y}N_y$, $(NiFe)_{100-z}O_z$, and $(NiFe)_{100-w}N_w$ as a X layer only for a reference layer are shown in FIGS. 7A-7D. The explanation of the X axis and the Y axis is the same as that of FIGS. 6A-6D.

The decrease of 10-20% for the MR ratio is observed in every sample. It is different from the case in which both of a reference layer and a free layer use an oxygen (O) or nitrogen (N) added magnetic material. However, the MR ratio is suddenly decreased at a certain level or higher of an oxygen (O) atomic fraction and a nitrogen (N) atomic fraction in every case; and it is enough if the atomic fraction of oxygen (O) or nitrogen (N) is 1% to control the degradation in every case. It is the same situation as FIGS. 6A-6D. As a result, the effect for adding oxygen (O) or nitrogen (N) is obtained under the following situations: x=1-10 at % for $(CoFe)_{100-x}O_x$; y=1-20 at % for $(CoFe)_{100-y}N_y$; z=1-10 at % for $(NiFe)_{100-z}O_z$; and w=1-30 at % for $(NiFe)_{100-w}N_w$.

It is understood that when an oxygen (O) or nitrogen (N) added magnetic material is used only for a free layer as an X layer instead of a reference layer as an X layer, the same result will be obtained. However, adding oxygen (O) or nitrogen (N) into a reference layer as an X layer is preferred because when a magnetic material containing oxygen (O) or nitrogen (N) is used for a reference layer, the magnetic layer functions as a base layer for a spacer layer.

Figure 8:
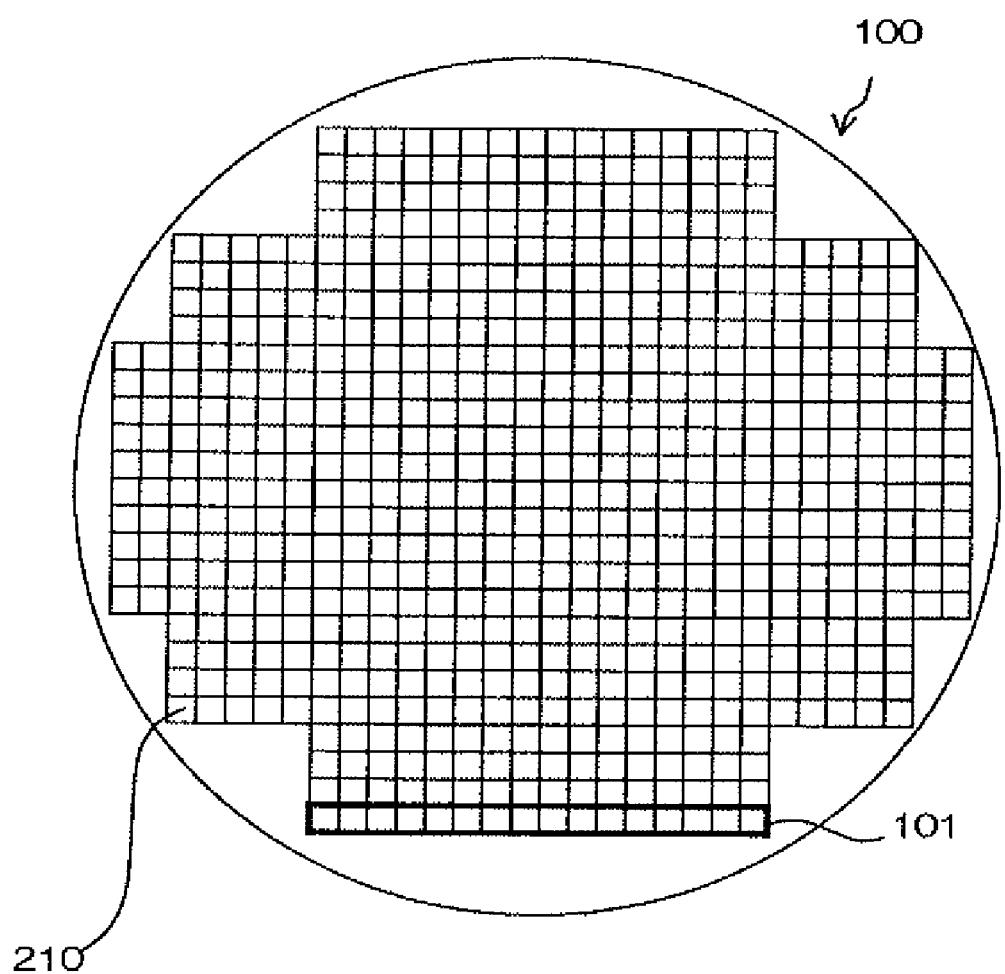
FIG. 8 is a top plan view of a wafer that is related to manufacturing of the thin film magnetic head according to the present invention.

Next, a wafer used for manufacturing the aforementioned thin film magnetic head is described below. As shown in FIG. 8, on a wafer 100 is formed at least a laminated body configuring the aforementioned thin film magnetic head. The wafer 101 is divided into a plurality of bars 101, which are work units for polishing the ABS S. After polishing, the bar 101 is cut into sliders 210, each containing a thin film magnetic head. The wafer 100 is provided with cutting margins (not shown) used for cutting the wafer 100 into bars 101 and the bars 101 into sliders 210.

Figure 9:
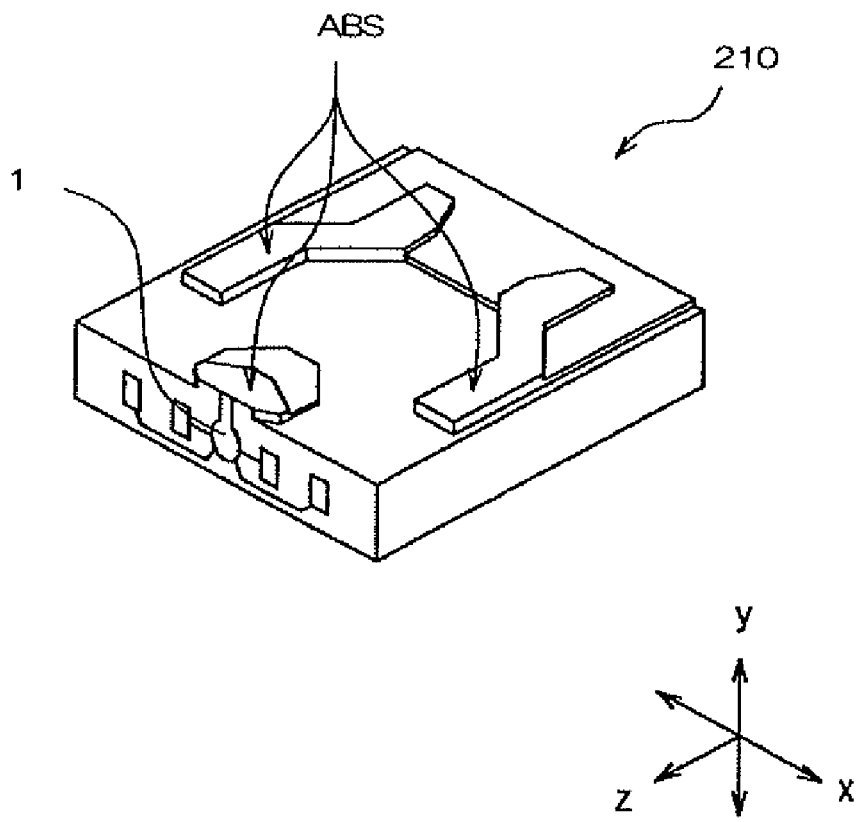
FIG. 9 is a perspective view of a slider according to the present invention.
Figure 9:
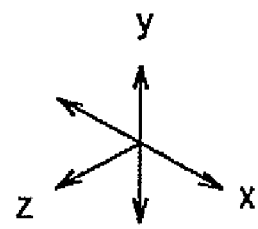

As shown in FIG. 9, the slider 210 is substantially hexahedron-shaped. One face thereof is the ABS S that faces a hard disk.

Figure 10:
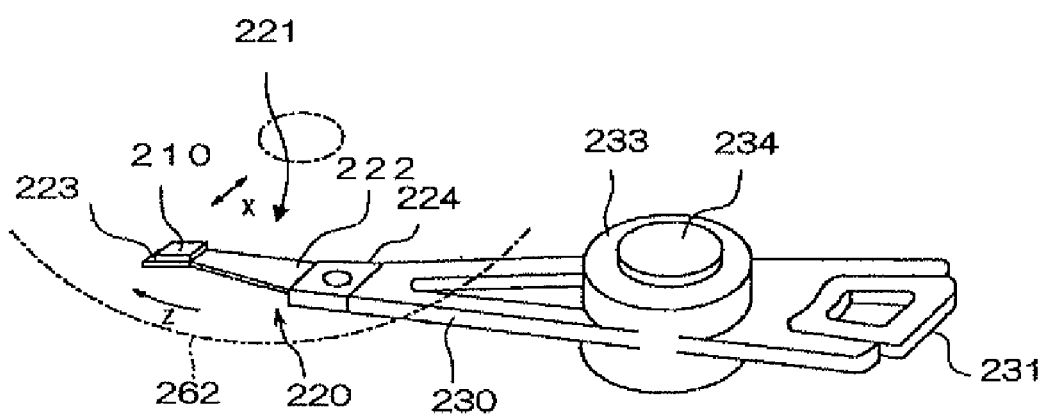
FIG. 10 is a perspective view of a head arm assembly that includes the head gimbal assembly assembled with the slider according to the present invention.

As shown in FIG. 10, a head gimbal assembly 220 comprises a slider 210 and a suspension 221 for elastically supporting the slider 210. The suspension 221 comprises a spring-set load beam 222 made of stainless steel, a flexure 223 provided on one edge of the load beam 222 and a base plate 224 provided on the other edge of the load beams 222. The flexure 223 is provided with the slider 210, giving a proper degree of freedom. On the section in which the slider 210 is mounted on the flexure 223 is provided a gimbal part for keeping the position of the slider 210 constant.

The slider 210 is placed inside a hard disk device, facing a hard disk, which is a disk-shaped recording medium to be rotated. At a time when a hard disk is rotated in the z direction in FIG. 10, airflow passing through the space between the hard disk and the slider 210 provides lift force for the slider 210 downward in the y direction. The slider 210 is moved away from the surface of the hard disk by the lift force. The thin film magnetic head 1 is formed in the vicinity of the edge portion on the air exit side (i.e., the edge portion on the lower left side in FIG. 9) of the slider 210.

The portion in which the head gimbal assembly 220 is mounted on an arm 230 is referred to as a head arm assembly 221. The arm 230 allows moving the slider 210 in the x direction crossing the track of the hard disk 262. One edge of the arm 230 is mounted on the base plate 224. On the other edge of the arm 230, a coil 231 is mounted, which constitutes part of the voice coil motor. A bearing part 233 is provided in the middle section of the arm 230. The arm 230 is rotatably supported by a shaft 233 mounted on the bearing part 233. The arm 230 and the voice coil motor for driving the arm 230 constitute an actuator.

Figure 11:
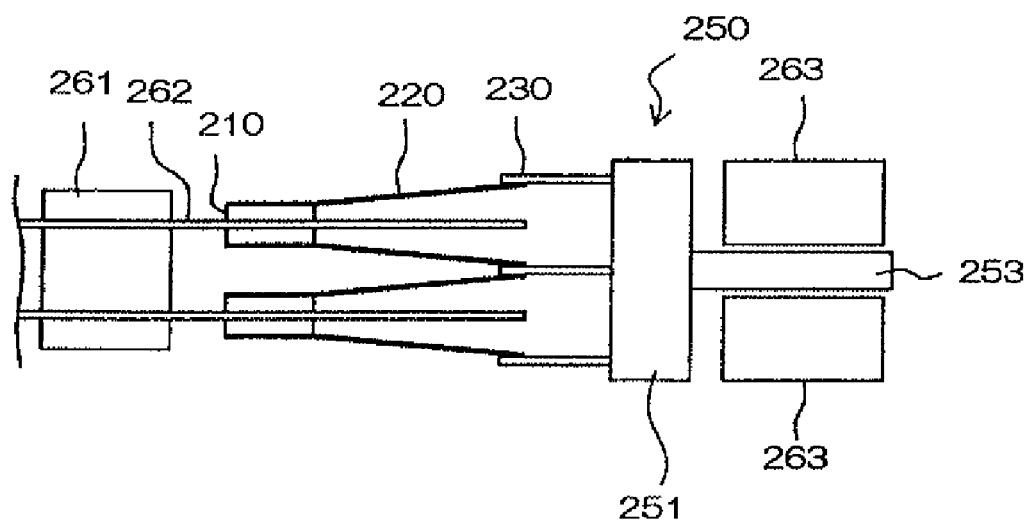
FIG. 11 is a side view of a head arm assembly assembled with the slider according to the present invention.
Figure 12:
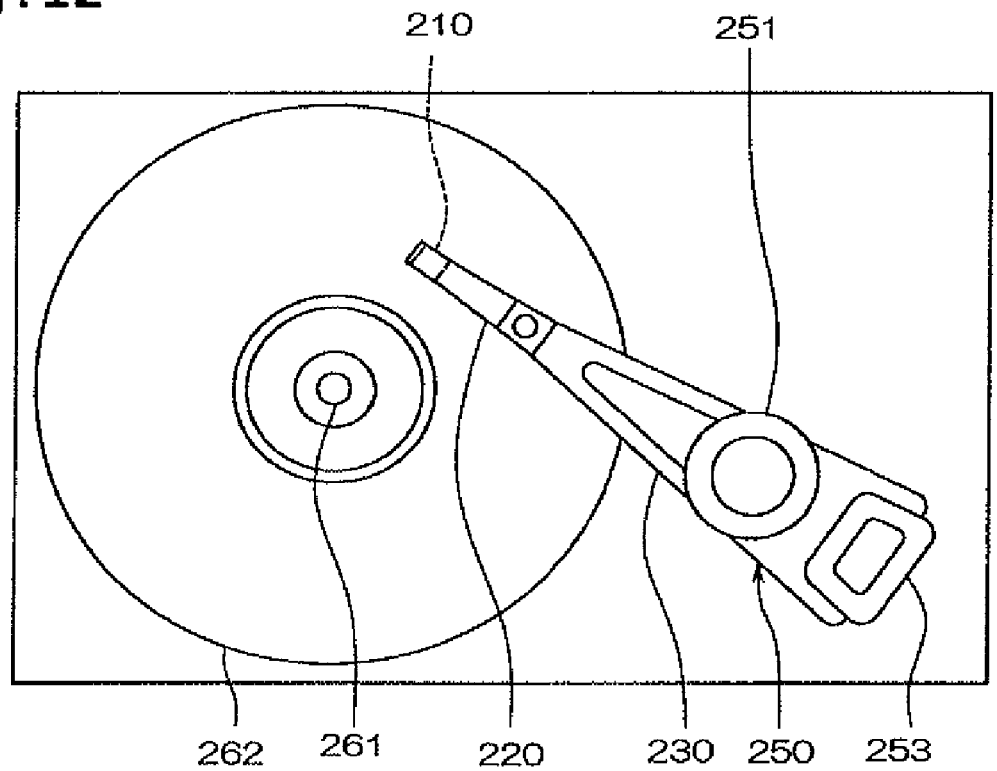
FIG. 12 is a top plan view of the magnetic disk device assembled with the slider according to the present invention.

Next, descriptions of a head stack assembly and a hard disk device, into which the aforementioned slider is integrated, are given below with reference to FIG. 11 and FIG. 12. The head stack assembly includes a carriage having a plurality of arms, wherein a head gimbal assembly 220 is mounted on each arm. FIG. 11 is a side view of the head stack assembly. FIG. 12 is a plan view of a hard disk device. The head stack assembly 250 includes a carriage 251 having a plurality of arms 252. On each arm 252, head gimbal assemblies 220 are mounted at an interval in the vertical direction. On the side of the carriage 251 opposite to the arm 230, the coil 253 is mounted, which constitutes part of a voice coil motor. The voice coil motor has permanent magnets 263 disposed facing each other on both sides of the coil 253.

As shown in FIG. 12, the head stack assembly 250 is integrated into the hard disk device. The hard disk device has multiple hard disks 262 mounted on a spindle motor 261. For each hard disk 262, two sliders 210 are disposed facing each other on both sides of the hard disk 262. The head stack assembly 250 (excluding the slider 210) and an actuator, which correspond to the positioning device according to the present invention, not only supports the slider 210 but also positions the slider 210 with respect to the hard disk 262. The slider 210 is moved in the direction crossing the track of the hard disk 262 by means of the actuator to be positioned with respect to the hard disk 262. The thin film magnetic head 1 of the slider 210 records information on the hard disk 262 by means of a recording head and reproduces information recorded on the hard disk 262 by means of a reproducing head.

A description of the preferred embodiment according to the present invention was given above in detail. However, it should be appreciated that a wide variety of alterations and modifications are possible as far as they do not depart from the spirit and scope of the attached claims.

What is claimed is:

1. A magneto-resistive effect element (MR element) comprising:
   a first magnetic layer and a second magnetic layer in which a relative angle of magnetization directions of the first and second magnetic layers changes according to an external magnetic field; and
   a spacer layer that is provided between the first magnetic layer and the second magnetic layer, wherein
   the spacer layer contains gallium nitride (GaN) as a main component,
   both the first magnetic layer and the second magnetic layer contains a non-metal added magnetic layer, the non-metal added magnetic layer facing the spacer layer and being structured of/in $(CoFe)_{100-x}O_x$ (x is an atomic fraction and satisfied with $1 \leq x \leq 10$).

2. The MR element according to claim 1, wherein a diffusion prevention layer that is made of one element from the group of Cu, Au, Ag, Zn, Cr, Rh, Pt, Pd, and Ir, is provided in a boundary; between the spacer layer and the first magnetic layer, between the spacer layer and the second magnetic layer, or in both of the boundaries.

3. A thin film magnetic head comprising:
   the MR element according to claim 1 that comprises the first magnetic layer and the second magnetic layer as free layers whose magnetization direction changes according to the external magnetic field; and
   a bias magnetic field application layer that applies a bias magnetic field to the first and second magnetic layers in an orthogonal direction to an air bearing surface (ABS) and the bias magnetic field application layer is formed in a rear side of the MR element seen from the ABS, wherein
   a sense current flows in a perpendicular direction to layer surfaces of the MR element.

4. A slider equipped with the thin film magnetic head according to claim 3.

5. A thin film magnetic head comprising:
   the MR element according to claim 1 that comprises the first magnetic layer as a reference layer, the magnetization direction of which is fixed regardless of the external magnetic field, and the second magnetic layer as a free layer, the magnetization direction of which changes according to the external magnetic field; and
   a bias magnetic field application layer, which is formed on both sides of the MR element in a track width direction and applies a bias magnetic field to the second magnetic layer in a track width direction.

6. A slider equipped with the thin film magnetic head according to claim 5.

7. A magneto-resistive effect element (MR element) comprising:
   a first magnetic layer and a second magnetic layer in which a relative angle of magnetization directions of the first and second magnetic layers changes according to an external magnetic field; and
   a spacer layer that is provided between the first magnetic layer and the second magnetic layer, wherein
   the spacer layer contains gallium nitride (GaN) as a main component,
   both the first magnetic layer and the second magnetic layer contains a non-metal added magnetic layer, the non-metal added magnetic layer facing the spacer layer and being structured with/in $(CoFe)_{100-y}N_y$ (y is an atomic fraction and satisfied with $1 \leq y \leq 20$).

8. The MR element according to claim 7, wherein a diffusion prevention layer that is made of one element from the group of Cu, Au, Ag, Zn, Cr, Rh, Pt, Pd, and Ir, is provided in a boundary; between the spacer layer and the first magnetic layer, between the spacer layer and the second magnetic layer, or in both of the boundaries.

9. A thin film magnetic head comprising:
   the MR element according to claim 7 that comprises the first magnetic layer and the second magnetic layer as free layers whose magnetization direction changes according to the external magnetic field; and a bias magnetic field application layer that applies a bias magnetic field to the first and second magnetic layers in an orthogonal direction to an air bearing surface (ABS) and the bias magnetic field application layer is formed in a rear side of the MR element seen from the ABS, wherein a sense current flows in a perpendicular direction to layer surfaces of the MR element.

10. A slider equipped with the thin film magnetic head according to claim 9.

11. A thin film magnetic head comprising:

the MR element according to claim 7 that comprises the first magnetic layer as a reference layer, the magnetization direction of which is fixed regardless of the external magnetic field, and the second magnetic layer as a free layer, the magnetization direction of which changes according to the external magnetic field; and a bias magnetic field application layer, which is formed on both sides of the MR element in a track width direction and applies a bias magnetic field to the second magnetic layer in a track width direction.

12. A slider equipped with the thin film magnetic head according to claim 11.

13. A magneto-resistive effect element (MR element) comprising:

a first magnetic layer and a second magnetic layer in which a relative angle of magnetization directions of the first and second magnetic layers changes according to an external magnetic field; and a spacer layer that is provided between the first magnetic layer and the second magnetic layer, wherein the spacer layer contains gallium nitride (GaN) as a main component, both the first magnetic layer and the second magnetic layer contains a non-metal added magnetic layer, the non-metal added magnetic layer facing the spacer layer and being structured with/in $(NiFe)_{100-z}O_z$ (z is an atomic fraction and satisfied with $1 \leq z \leq 10$).

14. The MR element according to claim 13, wherein a diffusion prevention layer that is made of one element from the group of Cu, Au, Ag, Zn, Cr, Rh, Pt, Pd, and Ir, is provided in a boundary; between the spacer layer and the first magnetic layer, between the spacer layer and the second magnetic layer, or in both of the boundaries.

15. A thin film magnetic head comprising:

the MR element according to claim 13 that comprises the first magnetic layer and the second magnetic layer as free layers whose magnetization direction changes according to the external magnetic field; and a bias magnetic field application layer that applies a bias magnetic field to the first and second magnetic layers in an orthogonal direction to an air bearing surface (ABS) and the bias magnetic field application layer is formed in a rear side of the MR element seen from the ABS, wherein a sense current flows in a perpendicular direction to layer surfaces of the MR element.

16. A slider equipped with the thin film magnetic head according to claim 15.

17. A thin film magnetic head comprising:

the MR element according to claim 13 that comprises the first magnetic layer as a reference layer, the magnetization direction of which is fixed regardless of the external magnetic field, and the second magnetic layer as a free layer, the magnetization direction of which changes according to the external magnetic field; and a bias magnetic field application layer, which is formed on both sides of the MR element in a track width direction and applies a bias magnetic field to the second magnetic layer in a track width direction.

18. A slider equipped with the thin film magnetic head according to claim 17.

19. A magneto-resistive effect element (MR element) comprising:

a first magnetic layer and a second magnetic layer in which a relative angle of magnetization directions of the first and second magnetic layers changes according to an external magnetic field; and a spacer layer that is provided between the first magnetic layer and the second magnetic layer, wherein the spacer layer contains gallium nitride (GaN) as a main component, both the first magnetic layer and the second magnetic layer contains a non-metal added magnetic layer, the non-metal added magnetic layer facing the spacer layer and being structured with/in $(NiFe)_{100-w}N_w$ (w is an atomic fraction and satisfied with $1 \leq w \leq 30$).

20. The MR element according to claim 19, wherein a diffusion prevention layer that is made of one element from the group of Cu, Au, Ag, Zn, Cr, Rh, Pt, Pd, and Ir, is provided in a boundary; between the spacer layer and the first magnetic layer, between the spacer layer and the second magnetic layer, or in both of the boundaries.

21. A thin film magnetic head comprising:

the MR element according to claim 19 that comprises the first magnetic layer and the second magnetic layer as free layers whose magnetization direction changes according to the external magnetic field; and a bias magnetic field application layer that applies a bias magnetic field to the first and second magnetic layers in an orthogonal direction to an air bearing surface (ABS) and the bias magnetic field application layer is formed in a rear side of the MR element seen from the ABS, wherein a sense current flows in a perpendicular direction to layer surfaces of the MR element.

22. A slider equipped with the thin film magnetic head according to claim 21.

23. A thin film magnetic head comprising:

the MR element according to claim 19 that comprises the first magnetic layer as a reference layer, the magnetization direction of which is fixed regardless of the external magnetic field, and the second magnetic layer as a free layer, the magnetization direction of which changes according to the external magnetic field; and a bias magnetic field application layer, which is formed on both sides of the MR element in a track width direction and applies a bias magnetic field to the second magnetic layer in a track width direction.

24. A slider equipped with the thin film magnetic head according to claim 23.

* * * * *